(12) United States Patent
Obara

(10) Patent No.: US 6,177,733 B1
(45) Date of Patent: Jan. 23, 2001

(54) SEMICONDUCTOR DEVICE

(75) Inventor: Ayumi Obara, Kanagawa (JP)

(73) Assignee: NEC Corporation, Tokyo (JP)

( * ) Notice: Under 35 U.S.C. 154(b), the term of this patent shall be extended for 0 days.

(21) Appl. No.: 09/295,333

(22) Filed: Apr. 21, 1999

(30) Foreign Application Priority Data

Apr. 27, 1998 (JP) .................................................. 10-116908

(51) Int. Cl.[7] .......................... H01L 23/48; H01L 23/52; H01L 29/40
(52) U.S. Cl. ........................... 257/786; 257/48; 438/612; 438/666
(58) Field of Search ..................... 257/786, 48; 438/612, 438/666

(56) References Cited

U.S. PATENT DOCUMENTS

| | | | |
|---|---|---|---|
| 5,698,903 | * 12/1997 | Parris et al. | 257/786 |
| 5,726,474 | * 3/1998 | Miller et al. | 257/364 |
| 5,923,091 | * 7/1999 | Nagai | 257/777 |
| 5,925,935 | * 7/1999 | Kim | 257/786 |
| 5,949,129 | * 9/1999 | Grandjean et al. | 257/48 |
| 6,064,113 | * 5/2000 | Kirkman | 257/691 |

FOREIGN PATENT DOCUMENTS

| | | |
|---|---|---|
| 4-361546 | 12/1992 | (JP) . |
| 9-199555 | 7/1997 | (JP) . |

* cited by examiner

Primary Examiner—Mahshid Saadat
Assistant Examiner—Jhihan B Clark
(74) Attorney, Agent, or Firm—McGinn & Gibb, P.C.

(57) ABSTRACT

A semiconductor device is provided with a semiconductor substrate and five electrode pads disposed on the semiconductor substrate. Four of the electrode pads form a rectangle, and the remaining one electrode pad is disposed on the substantial center of the rectangle. The semiconductor device is also provided with a plurality of semiconductor elements disposed between the electrode pads. The semiconductor elements are connected to any of the five electrode pads and used for measuring characteristics.

7 Claims, 10 Drawing Sheets

SEMICONDUCTOR DEVICE

BACKGROUND OF THE INVENTION

1. Field of the Invention

The present invention relates to a semiconductor device having a measuring element such as TEG (Test Element Group), and more particularly, to a semiconductor device in which an area of a pattern region for a measuring element is reduced.

2. Description of the Related Art

Conventionally, when a semiconductor device is designed, in addition to a circuit pattern for realizing its essential operation of the semiconductor device, a plurality of characteristic measuring patterns for evaluating and confirming characteristics of various semiconductor elements disposed in the circuit pattern are disposed in the same chip.

FIG. 1 is a schematic view showing a characteristic measuring pattern in an existing semiconductor device. A characteristic measuring pattern including electrode pads 1101 to 1103 for inputting and outputting electric signals from and to measuring elements (not shown) to be measured is formed in a measuring pattern region 1100. The shape of the measuring pattern region 1100 is rectangular, for example. The shape of the electrode pad 1101 is rectangular whose vertical side length is p and lateral side length is q. The shape of each of the electrode pads 1102 and 1103 is rectangular whose vertical side length is r and lateral side length is s. A distance t is provided between the electrode pad 1101 and the electrode pads 1102, 1103. Each of the electrode pads is disposed at a position away from a boundary of the measuring pattern region 1100 by a constant distance w. This is because the distance w is required between each of the electrode pads 1101 to 1103 for inputting and outputting electric signals to and from the measuring elements, and other electrode pads.

FIG. 2 is a schematic view showing an existing characteristic measuring pattern including four measuring pattern regions shown in FIG. 1. There are provided a first measuring pattern region 1200a in which a first measuring element is disposed, a second measuring pattern region 1200b in which a second measuring element is disposed, a third measuring pattern region 1200c in which a third measuring element is disposed, and a fourth measuring pattern region 1200d in which a fourth measuring element is disposed, in a measuring pattern region 1200. Each of the measuring pattern regions 1200a to 1200d has the same structure as that of the above-described measuring pattern region 1100.

The first and second measuring pattern regions 1200a and 1200b have a mutually superposed region, the second and third measuring pattern regions 1200b and 1200c have a mutually superposed region, and the third and fourth measuring pattern regions 1200c and 1200d have a mutually superposed region. Each of distances between the electrode pads 1203a and 1202b, between the electrode pads 1203b and 1202c, and between the electrode pads 1203c and 1202d is w. The characteristic measuring pattern is constructed in this manner.

In the measuring pattern region 1200 shown in FIG. 2, if p=40 $\mu$m, q=40 $\mu$m, r=50 $\mu$m, s=40 $\mu$m, t=15 $\mu$m, and w=20 $\mu$m, the area is 78,300 $\mu m^2$, and the chip size is extremely large.

When developing a new element, various measurement and evaluation are conducted and therefore, a TEG (Test Element Group) in which various evaluation elements are mounted and disposed is used. However, in the above-described existing semiconductor device, the number of elements that can be mounted per one chip when the TEG is used is limited.

Thereupon, there is disclosed a semiconductor device in which an electrode pad is shared by two adjacent measuring pattern regions (Japanese Patent Application Laid-open No. 4-361546 (published on Dec. 15, 1992)).

FIG. 3 is a schematic view showing a characteristic measuring pattern in a conventional semiconductor device disclosed in Japanese Patent Application Laid-open No. 4-361546 which is applied to four measuring elements. When the semiconductor device disclosed in Japanese Patent Application Laid-open No. 4-361546 is applied to four measuring elements, nine probe electrode pads 1301 to 1309 are provided.

There is provided a first measuring pattern region 1300a including electrode pads 1301 to 1303 in which a first measuring element is disposed. Similarly, there are provided a second measuring pattern region 1300b including electrode pads 1303 to 1305 in which a second measuring element is disposed, a third measuring pattern region 1300c including electrode pads 1305 to 1307 in which a third measuring element is disposed, and a fourth measuring pattern region 1300d including electrode pads 1307 to 1309 in which a fourth measuring element is disposed. That is, the electrode pads 1303, 1305, 1307 and 1309 are shared by two measuring pattern regions. The characteristic measuring pattern is constructed in this manner.

When an MOS (Metal Oxide Semiconductor) transistor is used as the measuring element, a gate of the first measuring element is connected to the electrode pad 1302, a drain of the first measuring element is connected to the electrode pad 1301, and a source of the first measuring element is connected to the electrode pad 1303.

According to the disposing method disclosed in the Japanese Patent Application Laid-open No. 4-361546, a layout area of the characteristic measuring pattern is deleted as compared with a previous case in which the electrode pad is not shared by two patterns.

However, in recent years, the semiconductor devices are becoming larger scale and denser. This tendency increases the variety of elements constituting the semiconductor devices. Therefore, the number and kinds of the measuring element to be mounted on the same chip as the semiconductor element for evaluating the characteristics are increased. As a result, a region occupied by the characteristic measuring pattern, especially by its electrode pad is increased, and the chip is increased in size.

As a result, it becomes impossible to sufficiently suppress the increase of the chip size by the disposing method disclosed in the above-described Japanese Patent Application Laid-open No. 4-361546.

When the TEG is used, the number of measuring elements which are required to be mounted on one chip is largely increased, and a region occupied by their electrode pads is not sufficiently small. Thus, it is necessary to increase the chip size of the TEG, or to reduce the number of measuring elements to be mounted.

SUMMARY OF THE INVENTION

It is an object of the present invention to provide a semiconductor device capable of reducing an area occupied by an electrode pad provided for evaluating the characteristics of a semiconductor element, and capable of effectively reducing an area of a characteristic measuring pattern in which the electrode pad is included.

According to one aspect of the present invention, a semiconductor device may be provided with a semiconductor substrate and five electrode pads disposed on the semiconductor substrate. Four of the electrode pads may form a rectangle, and the remaining one electrode pad may be disposed on the substantial center of the rectangle. The semiconductor device may be also provided with a plurality of semiconductor elements disposed between the electrode pads. The semiconductor elements may be connected to any of the five electrode pads and used for measuring characteristics.

A plurality of basic regions including five electrode pads disposed as same as the five electrode pads may be provided, and two of the electrode pads may be shared by two of the basic regions.

The semiconductor elements may be connected to the electrode pads located at vertexes of the rectangle.

The rectangle may be a regular square.

The semiconductor element may be a transistor. In this case, the transistor is preferably a field-effect transistor, and any one of a gate, a drain and a source of the field-effect transistor is preferably connected to the electrode pad located at the substantial center of the rectangle. The remaining two of the gate, the drain and the source of the field-effect transistor are preferably connected to the electrode pads located at vertexes of the rectangle.

Further, the plurality of semiconductor elements may include at least an N-channel MOS transistor and a P-channel MOS transistor.

According to the present invention, the four electrode pads to which the semiconductor elements used for measuring the characteristics may be disposed on the semiconductor substrate such as to form the rectangle, and the one electrode pad may be disposed at the substantial center of the rectangle. Therefore, the area occupied by the electrode pads is reduced. As a result, the area of the characteristic measuring pattern including the electrode pads is remarkably reduced, and the areas of the entire chips are reduced. Further, more measuring semiconductor elements can be mounted on a chip of the same size as the conventional chip.

DETAILED DESCRIPTION OF THE PREFERRED EMBODIMENTS

Figure 4:
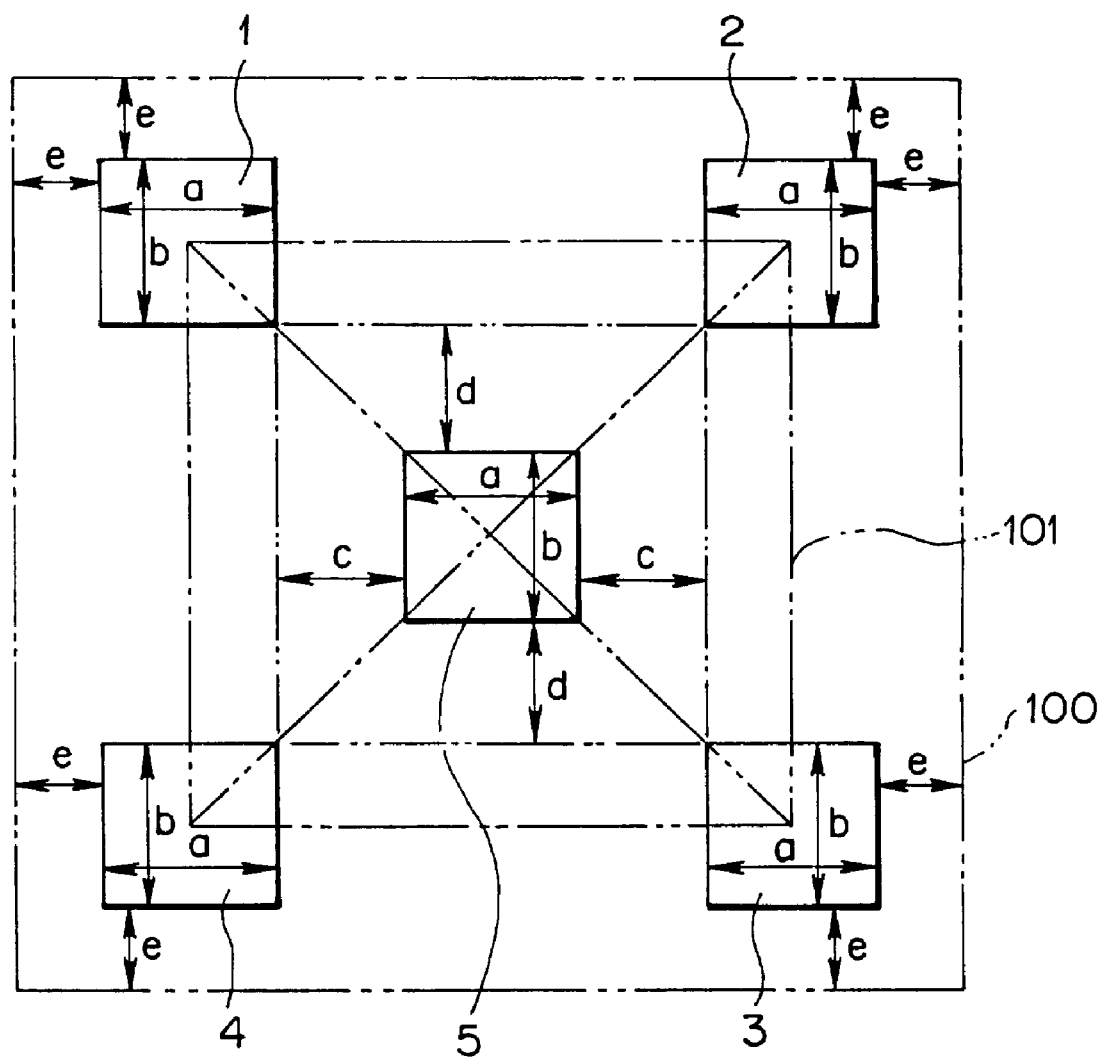
FIG. 4 is a schematic view showing a characteristic measuring pattern in a semiconductor device according to first to fifth embodiments of the present invention.

Semiconductor devices according to embodiments of the present invention will be explained concretely with reference to the accompanying drawings below. FIG. 4 is a schematic view showing a characteristic measuring pattern in a semiconductor device according to first to fifth embodiments of the present invention. As a measuring element, an N-channel MOS transistor or a P-channel MOS transistor may be used, for example.

In each of the first to fifth embodiments, five electrode pads 1 to 5 are disposed in a rectangular measuring pattern region 100. Each of the electrode pads 1 to 4 may be disposed at a position away from a boundary of the measuring pattern region 100 by a distance e. A rectangle 101 is formed by a line segment connecting the centers of the electrode pads 1 and 2, a line segment connecting the centers of the electrode pads 2 and 3, a line segment connecting the centers of the electrode pads 3 and 4, and a line segment connecting the centers of the electrode pads 4 and 1. The electrode pad 5 is disposed such that its center coincides with a point of intersection of diagonal lines of the rectangle 101, i.e., the center of the rectangle 101.

In each of the electrode pads 1 to 5, the lateral side length is a, and the vertical side length is b. A distance c may be provided between a straight line lying on the vertical sides of the electrode pads 1 and 4 at the side of the electrode pad 5, and a straight line lying on the vertical side of the electrode pad 5 at the side of the electrode pads 1 and 4. Similarly, a distance c may be provided between a straight line lying on the vertical sides of the electrode pads 2 and 3 at the side of the electrode pad 5, and a straight line lying on the vertical side of the electrode pad 5 at the side of the electrode pads 2 and 3. Further, a distance d may be provided between a straight line lying on the lateral sides of the electrode pads 1 and 2 at the side of the electrode pad 5, and a straight line lying on the lateral side of the electrode pad 5 at the side of the electrode pads 1 and 2. Similarly, a distance d may be provided between a straight line lying on the lateral sides of the electrode pads 3 and 4 at the side of the electrode pad 5, and a straight line lying on the lateral side of the electrode pad 5 at the side of the electrode pads 3 and 4. The characteristic measuring pattern is preferably constructed in this manner.

Figure 5:
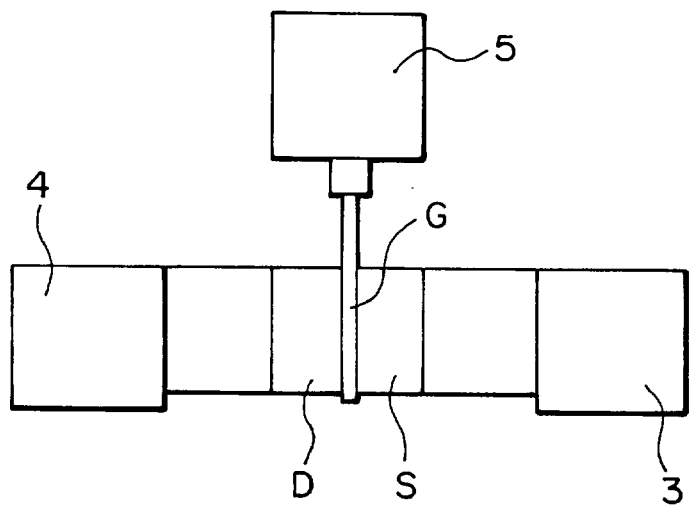
FIG. 5 is a schematic view showing the relation between three electrode pads and one MOS transistor.

One MOS transistor as a measuring element is connected to the three electrode pads. FIG. 5 is a schematic view showing the relation between the three electrode pads and the one MOS transistor. For example, a gate G of a MOS transistor is connected to the electrode pad 5. A drain D of the MOS transistor is connected to the electrode pad 4. A source S of the MOS transistor is connected to the electrode pad 3. For the purpose of simplification, a well, a contact and such are omitted.

In this manner, when the MOS transistor is used as a measuring element, one of the gate, the drain and the source of the MOS transistor is preferably connected to the electrode pad 5 disposed at the center of the rectangle 101 and the two electrode pads disposed at adjacent two vertexes of the rectangle 101. Therefore, in the first to fifth embodiments shown in FIG. 4, it is possible to evaluate the characteristics of four MOS transistors.

Therefore, according to these embodiments, when four MOS transistor are used, an area of the measuring pattern region is reduced in the following manner. For example, if the vertical length a and the lateral length b of each of the electrode pads 1 to 5 are 50 $\mu$m, the minimum distance e between the electrode pads is 20 $\mu$m, and both the distances c and d are 15 $\mu$m, an area of the measuring pattern region 100 is 48,400 $\mu m^2$.

Figure 2:
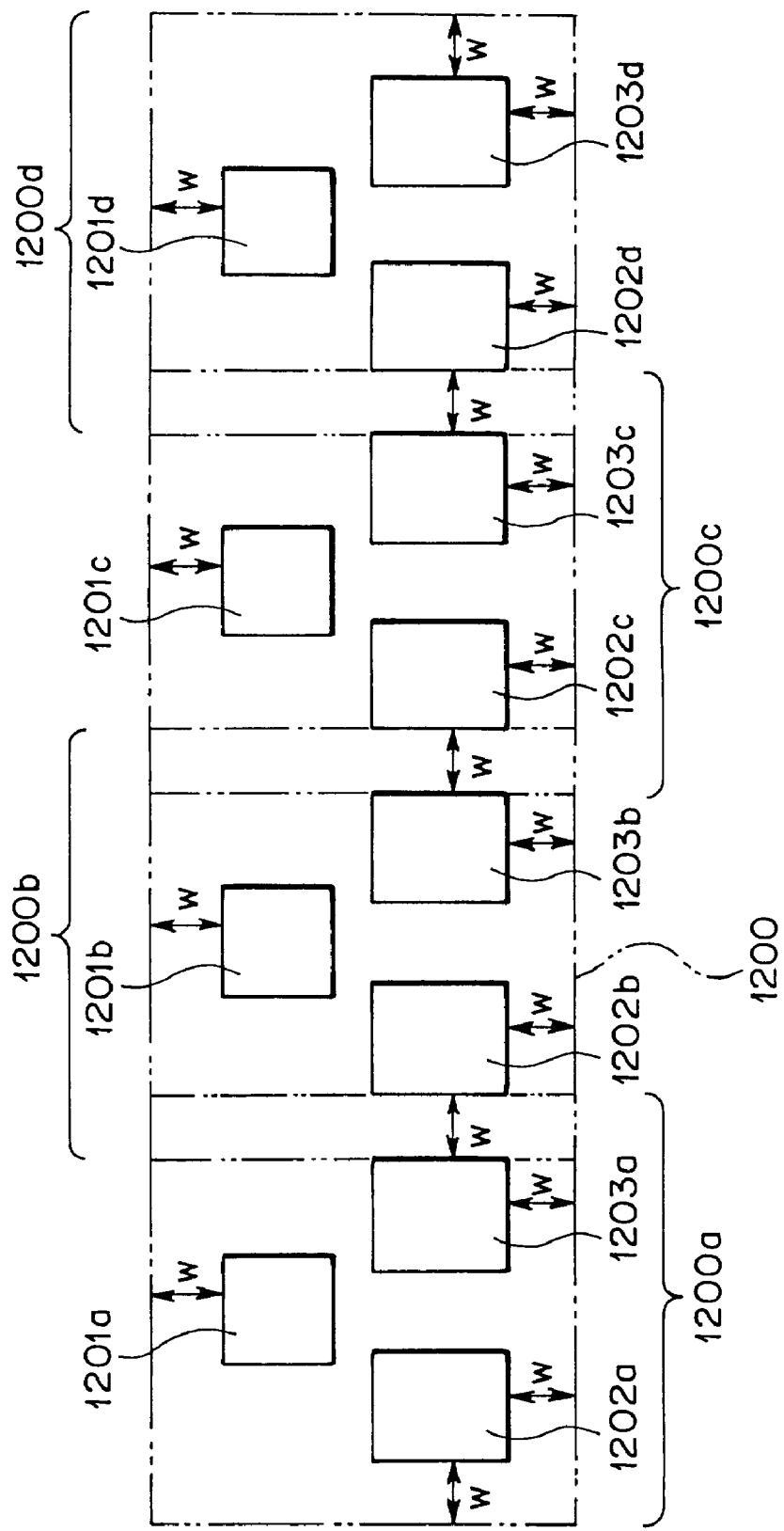
FIG. 2 is a schematic view showing an existing characteristic measuring pattern including four measuring pattern regions shown in FIG. 1.
Figure 3:
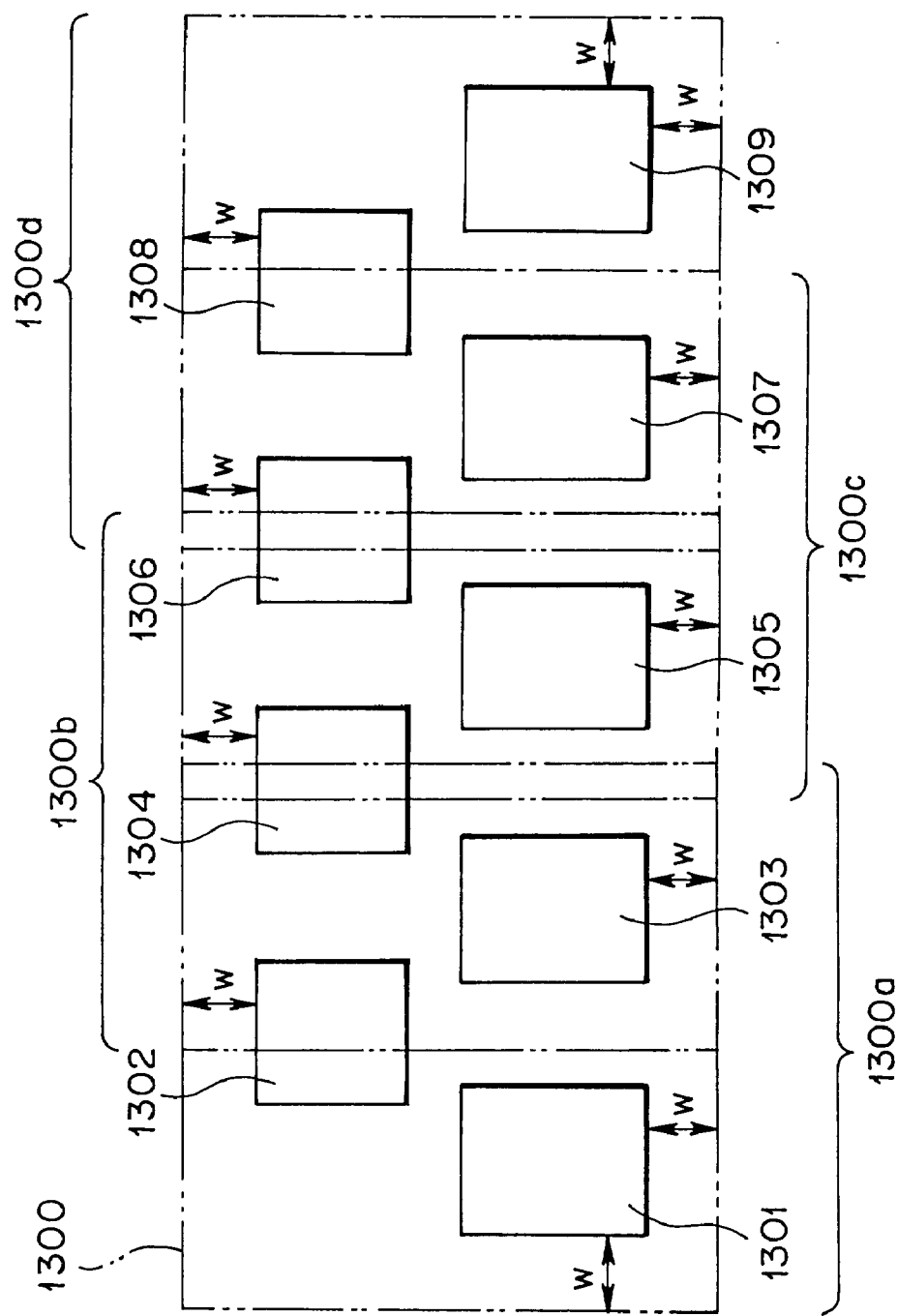
FIG. 3 is a schematic view showing a characteristic measuring pattern in a conventional semiconductor device disclosed in Japanese Patent Application Laid-open No. 4-361546 applied to four measuring elements.

On the other hand, in the existing pattern shown in FIG. 2, the fact that the arrangement of the measuring pattern region is one dimensional is taken into account, and the size of the electrode pad is slightly reduced, and if p=40 $\mu$m, q=40 $\mu$m, r=50 $\mu$m, s=40 $\mu$m, t=15 $\mu$m, and w=20 $\mu$m, an area of 78,300 $\mu m^2$ is necessary for four measuring element. In the conventional pattern shown in FIG. 3, an area of 52,200 $\mu m^2$ is necessary under the same conditions as those of the pattern shown in FIG. 2.

That is, according to these embodiment, it is possible to reduce the area of the measuring pattern region by 29,900 $\mu m^2$ (about 38.2%) as compared with the existing semiconductor device shown in FIG. 2. As compared with the conventional semiconductor device shown in FIG. 3, the area of the measuring pattern region can be reduced by 3,800 $\mu m^2$ (about 7.3%).

Figure 6:
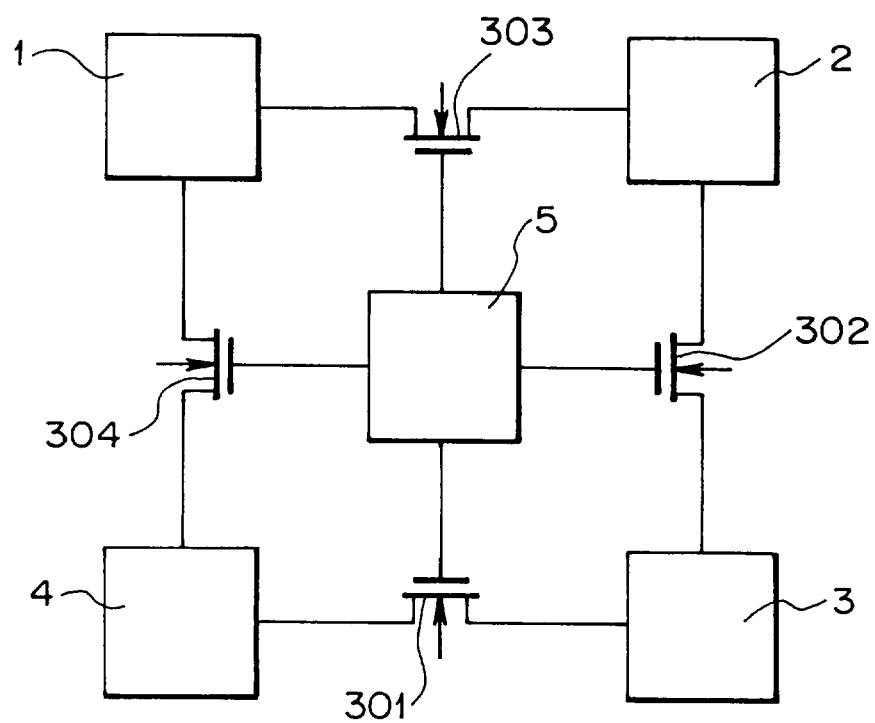
FIG. 6 is a schematic view showing a semiconductor device according to a first embodiment of the present invention.
Figure 7:
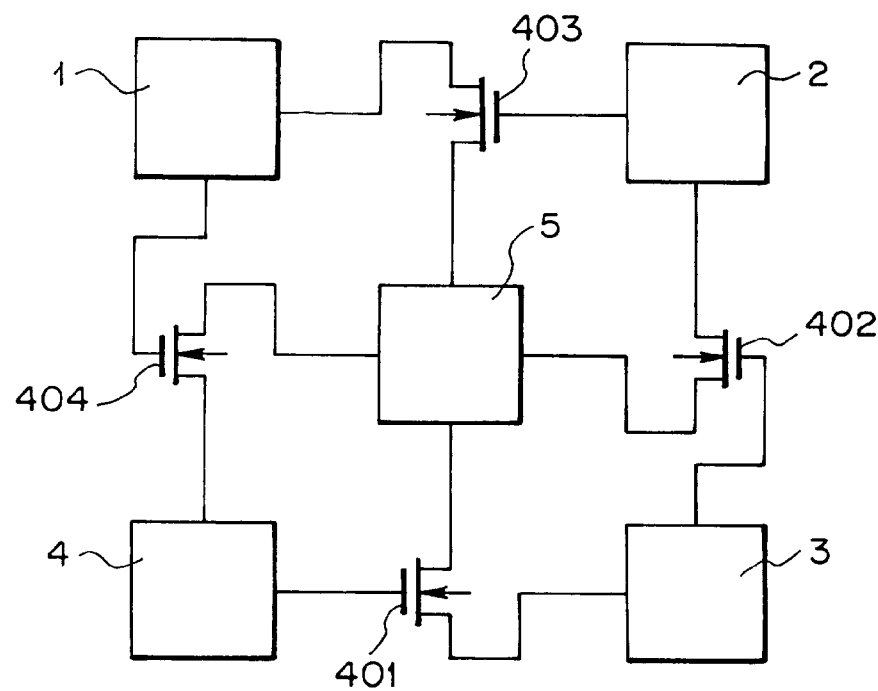
FIG. 7 is a schematic view showing a semiconductor device according to a second embodiment of the present invention.
Figure 8:
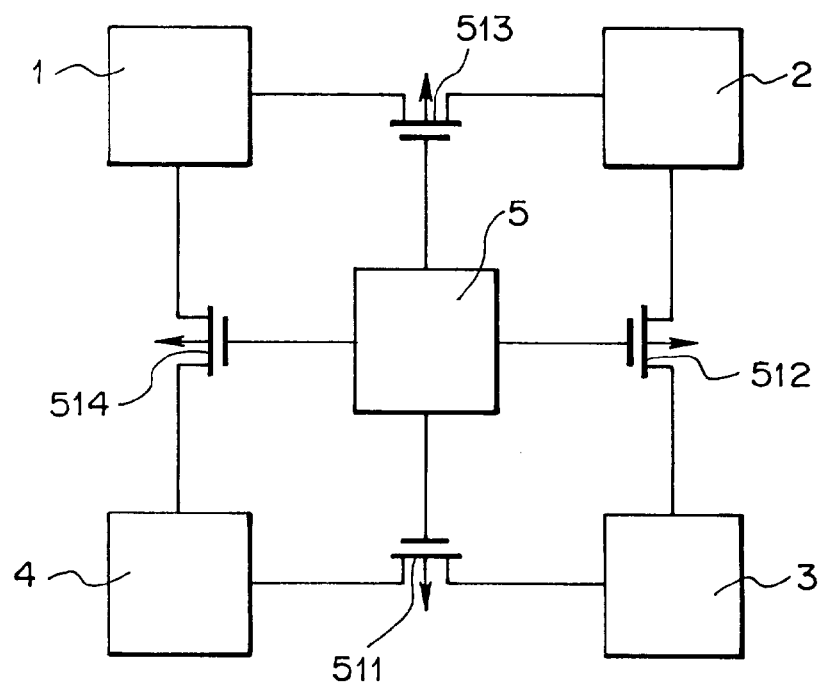
FIG. 8 is a schematic view showing a semiconductor device according to a third embodiment of the present invention.
Figure 9:
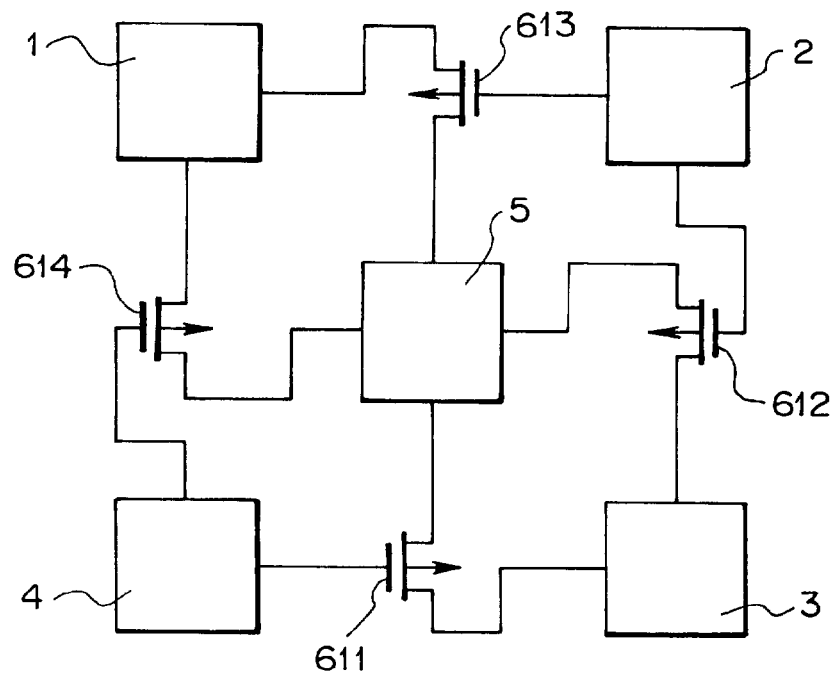
FIG. 9 is a schematic view showing a semiconductor device according to a fourth embodiment of the present invention.
Figure 10:
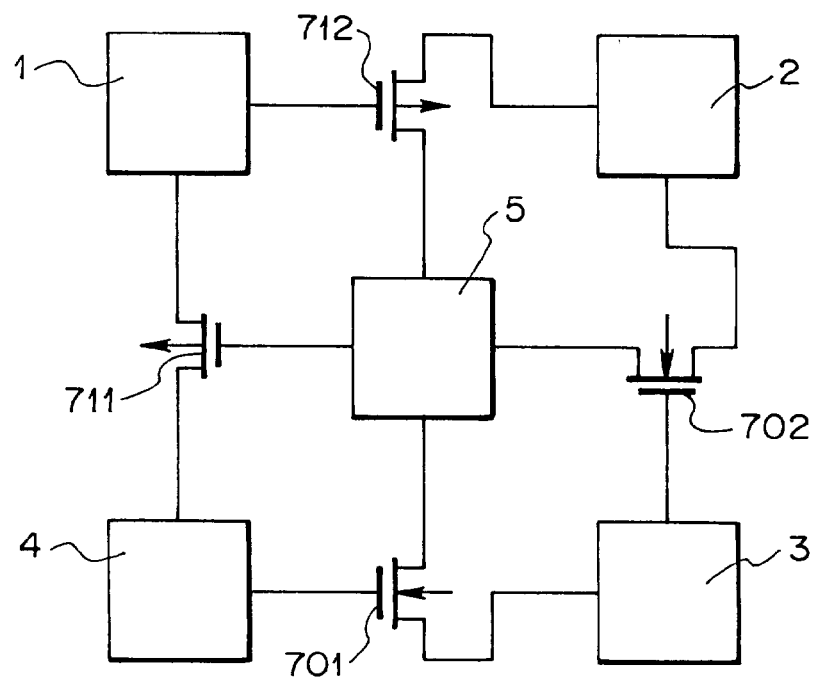
FIG. 10 is a schematic view showing a semiconductor device according to a fifth embodiment of the present invention.

FIG. 6 is a schematic view showing a semiconductor device according to the first embodiment, and FIG. 7 is a schematic view showing a semiconductor device according to the second embodiment. FIG. 8 is a schematic view showing a semiconductor device according to the third embodiment, FIG. 9 is a schematic view showing a semiconductor device according to the fourth embodiment, and FIG. 10 is a schematic view showing a semiconductor device according to the fifth embodiment.

In the first embodiment shown in FIG. 6, one of a source and a drain of an N-channel MOS transistor 301 is connected to the electrode pad 3, and the other one of the source and the drain of the N-channel MOS transistor 301 is connected to the electrode pad 4. One of a source and a drain of an N-channel MOS transistor 302 is connected to the electrode pad 2, and the other one of the source and the drain of the N-channel MOS transistor 302 is connected to the electrode pad 3. One of a source and a drain of an N-channel MOS transistor 303 is connected to the electrode pad 1, and the other one of the source and the drain of the N-channel MOS transistor 303 is connected to the electrode pad 2. One of a source and a drain of an N-channel MOS transistor 304 is connected to the electrode pad 4, and the other one of the source and the drain of the N-channel MOS transistor 304 is connected to the electrode pad 1. Gates of the N-channel MOS transistors 301 to 304 are connected to the electrode pad 5.

A substrate electric potential (P-type well electric potential) of each of the N-channel MOS transistors 301 to 304 is connected to the lowest electric potential.

In the semiconductor device of the first embodiment constructed in the above-described manner, a method for measuring a threshold voltage VTH of the N-channel MOS transistor 301 will be explained next.

When the measurement is conducted, for example, the electrode pad 3 is connected to the ground potential corresponding to the lowest potential, and the electrode pad 4 is connected to the power source potential corresponding to the highest potential through an ampere meter (not shown). Next, voltage is applied to the electrode pad 5 while varying its level. Then, voltage Vn applied to the electrode pad 5 when electric current starts flowing to the electrode pad 4 is measured. The voltage Vn measured in this manner is a threshold voltage VTH of the N-channel MOS transistor 301.

The N-channel MOS transistors 302 to 304 which are connected to one another in series are connected to the MOS transistor 301 in parallel. Gate potentials of these N-channel MOS transistor 302 to 304 are also varied like a gate potential of the N-channel MOS transistor 301. For this reason, it may seem that an error can be caused by the N-channel MOS transistors 302 to 304.

However, as described above, since the N-channel MOS transistors 302 to 304 are connected to one another in series, if the voltage applied to the electrode pad 305 is increased, the source potentials of the N-channel MOS transistors 303 and 304 are increased, and effective voltage between the gates and sources of these transistors is decreased. Further, since body effect is also generated, at least the N-channel MOS transistor 304 is brought into a cutoff state with voltage of such low magnitude that the N-channel MOS transistor 301 is brought into an electrically conductive state, and in many cases, the N-channel MOS transistor 303 is also brought into a cutoff state. Therefore, the measurement of the threshold voltage VTH of the N-channel MOS transistor 301 is not susceptible to the above-described environment.

The electrode pad 3 may be connected to the power source potential through the ampere meter, and the electrode pad 4 may be connected to the ground potential.

The threshold voltages VTH of the other N-channel MOS transistors 302 to 304 can also be measured in the same manner.

In the second embodiment shown in FIG. 7, one of a source and a drain of an N-channel MOS transistor 401 is connected to the electrode pad 3, and a gate of the N-channel MOS transistor 401 is connected to the electrode pad 4. One of a source and a drain of an N-channel MOS transistor 402 is connected to the electrode pad 2, and a gate of the N-channel MOS transistor 402 is connected to the electrode pad 3. One of a source and a drain of an N-channel MOS transistor 403 is connected to the electrode pad 1, and a gate of the N-channel MOS transistor 403 is connected to the electrode pad 2. One of a source and a drain of an N-channel MOS transistor 404 is connected to the electrode pad 4, and a gate of the N-channel MOS transistor 404 is connected to the electrode pad 1. The other ones of the sources and the drains of the N-channel MOS transistor 401 to 404 are connected to the electrode pad 5.

A substrate electric potential (P-type well electric potential) of each of the N-channel MOS transistors 401 to 404 is connected to the lowest electric potential.

In the semiconductor device of the second embodiment constructed in the above-described manner, a method for measuring a threshold voltage VTH of the N-channel MOS transistor 401 will be explained next.

When the measurement is conducted, the electrode pads 1, 2 and 5 are connected to the ground potential, and the electrode pad 3 is connected to the power source potential through an ampere meter (not shown). Next, voltage is applied to the electrode pad 4 while varying its level. Then, voltage Vn applied to the electrode pad 4 when electric current starts flowing to the electrode pad 4 is measured. The voltage Vn measured in this manner is a threshold voltage VTH of the N-channel MOS transistor 401.

During the above measurement, the N-channel MOS transistors 403 and 404 are in cutoff state, and the N-channel MOS transistor 402 is in conductive state. For this reason, it may seem that an error can be caused.

However, since the electrode pads 2 and 5 are both connected to the ground potential, no current flows to the N-channel MOS transistor 402. Therefore, the measurement of the threshold voltage VTH of the N-channel MOS transistor 401 is not susceptible to the above-described environment.

The electrode pad 4 may be connected to the power source potential through the ampere meter, and voltage may be applied to the electrode pad 3.

The threshold voltages VTH of the other N-channel MOS transistors 402 to 404 can also be measured in the same manner.

In the third embodiment shown in FIG. 8, one of a source and a drain of an P-channel MOS transistor 511 is connected to the electrode pad 3, and the other one of the source and the drain of the P-channel MOS transistor 511 is connected to the electrode pad 4. One of a source and a drain of an P-channel MOS transistor 512 is connected to the electrode pad 2, and the other one of the source and the drain of the P-channel MOS transistor 512 is connected to the electrode pad 3. One of a source and a drain of an P-channel MOS transistor 513 is connected to the electrode pad 1, and the other one of the source and the drain of the P-channel MOS transistor 513 is connected to the electrode pad 2. One of a source and a drain of an P-channel MOS transistor 514 is connected to the electrode pad 4, and the other one of the source and the drain of the P-channel MOS transistor 514 is connected to the electrode pad 1. Gates of the P-channel MOS transistors 511 to 514 are connected to the electrode pad 5.

A substrate electric potential (N-type well electric potential) of each of the P-channel MOS transistors 511 to 514 is connected to the highest electric potential.

In the semiconductor device of the third embodiment constructed in the above-described manner, when the threshold voltage of the P-channel MOS transistor is measured, the electric potential of each of two electrode pads other than three ones connected to a transistor which is to be measured is appropriately set as in the first embodiment. With this setting, the threshold voltage can precisely be measured without being influenced by the transistors which are not to be measured.

In the fourth embodiment shown in FIG. 9, one of a source and a drain of a P-channel MOS transistor 611 is connected to the electrode pad 3, and a gate of the P-channel MOS transistor 611 is connected to the electrode pad 4. One of a source and a drain of a P-channel MOS transistor 612 is connected to the electrode pad 3, and a gate of the P-channel MOS transistor 612 is connected to the electrode pad 2. One of a source and a drain of a P-channel MOS transistor 613 is connected to the electrode pad 1, and a gate of the P-channel MOS transistor 613 is connected to the electrode pad 2. One of a source and a drain of a P-channel MOS transistor 614 is connected to the electrode pad 1, and a gate of the P-channel MOS transistor 614 is connected to the electrode pad 4. The other one of the sources and the drains of the P-channel MOS transistor 611 to 614 are connected to the electrode pad 5.

A substrate electric potential (N-type well electric potential) of each of the P-channel MOS transistors 611 to 614 is connected to the highest electric potential.

In the semiconductor device of the fourth embodiment constructed in the above-described manner, when the threshold voltage of the P-channel MOS transistor is measured, the electric potential of each of two electrode pads other than three ones connected to a transistor which is to be measured is appropriately set as in the second embodiment. With this setting, the threshold voltage can precisely be measured without being influenced by the transistors which is not to be measured.

In the fifth embodiment shown in FIG. 10, one of a source and a drain of an N-channel MOS transistor 701 is connected to the electrode pad 3, a gate of the N-channel MOS transistor 701 is connected to the electrode pad 4. One of a source and a drain of an N-channel MOS transistor 702 is connected to the electrode pad 2, a gate of the N-channel MOS transistor 702 is connected to the electrode pad 3.

Further, one of a source and a drain of a P-channel MOS transistor 712 is connected to the electrode pad 2, a gate of the P-channel MOS transistor 712 is connected to the electrode pad 1. One of a source and a drain of a P-channel MOS transistor 711 is connected to the electrode pad 1, and the other one of the source or the drain of the p-channel MOS transistor 711 is connected to the electrode pad 4.

The other ones of the sources and the drains of the N-channel MOS transistors 701 and 702, and the other one of the source and the drain of the P-channel MOS transistor 712 are connected to the electrode pad 5. Further, a gate of the P-channel MOS transistor 711 is connected to the electrode pad 5.

A substrate electric potential (P-type well electric potential) of each of the N-channel MOS transistors 701 and 702 is connected to the lowest electric potential. A substrate electric potential (N-type well electric potential) of each of the P-channel MOS transistors 711 and 712 is connected to the highest electric potential.

In the semiconductor device of the fifth embodiment constructed in the above-described manner, a method for measuring a threshold voltage VTH of the N-channel MOS transistor will be explained next.

When the threshold voltage VTH of the N-channel MOS transistor 701 is measured, the electrode pads 2 and 3 are connected to the ground potential, and the electrode pad 5 is connected to the power source potential through an ampere meter (not shown). The electrode pad 1 is connected to the power source potential. According to this connection state, the N-channel MOS transistor 702 and the P-channel MOS transistors 711 and 712 are all in cutoff state. Therefore, the measurement of the threshold voltage VTH of the N-channel MOS transistor 701 is not susceptible to the above-described environment.

Then, voltage is applied to the electrode pad 4 while varying its level. Then, voltage Vn applied to the electrode pad 4 when electric current starts flowing to the electrode pad 5 is measured. The voltage Vn obtained in this manner is a threshold voltage VTH of the N-channel MOS transistor 701. The value of the power source potential is determined by measuring conditions of the transistor 701, which is a measuring element.

When the threshold voltage VTH of the N-channel MOS transistor 702 is measured, the electrode pads 2 and 4 are connected to the ground potential, and the electrode pad 1 is connected to the power source potential. The electrode pad 5 is connected to the power source through an ampere meter (not shown). Then, voltage is applied to the electrode pad 3 while varying its level. Then, voltage Vn applied to the electrode pad 3 when electric current starts flowing to the electrode pad 5 is measured, whereby the threshold voltage VTH can be obtained as in the same manner as that of the N-channel MOS transistor 701.

Next, a method for measuring the threshold voltage VTH of the P-channel MOS transistor will be explained.

When the threshold voltage VTH of the P-channel MOS transistor 711 is measured, the electrode pad 1 is connected to the power source potential, the electrode pads 2 and 3 are connected to the ground potential, and the electrode pad 4 is connected to the power source potential through an ampere meter (not shown). Then, voltage is applied to the electrode pad 5 while varying its level. Next, voltage Vp applied to the electrode pad 5 when the current starts flowing to the electrode pad 4 is measured. A value obtained by (Vp−VDD) in this case is the threshold voltage VTH of the P-channel MOS transistor 711. The value VDD means a value of the power source potential.

During the measurement, since the N-channel MOS transistor 701 and 702 and the P-channel MOS transistor 712 are in cutoff state, the measurement of the threshold voltage VTH of the P-channel MOS transistor 711 is not susceptible to the above-described environment.

When the threshold voltage VTH of the P-channel MOS transistor 712 is measured, the electrode pad 5 is connected to the power source potential, the electrode pads 3 and 4 are connected to the ground potential, and the electrode pad 2 is connected to the power source potential through an ampere meter (not shown). Then, voltage is applied to the electrode pad 1 while varying its level. Next, voltage applied to the electrode pad 1 when the current starts flowing to the electrode pad 2 is measured. The threshold voltage VTH of the P-channel MOS transistor 712 can be obtained in this manner as the P-channel MOS transistor 711.

The arrangements of the transistors and connection states of the electrode pads described above are only examples, and other arrangements and such are also possible only if the measurement of the measuring element is not susceptible to other element.

Figure 11:
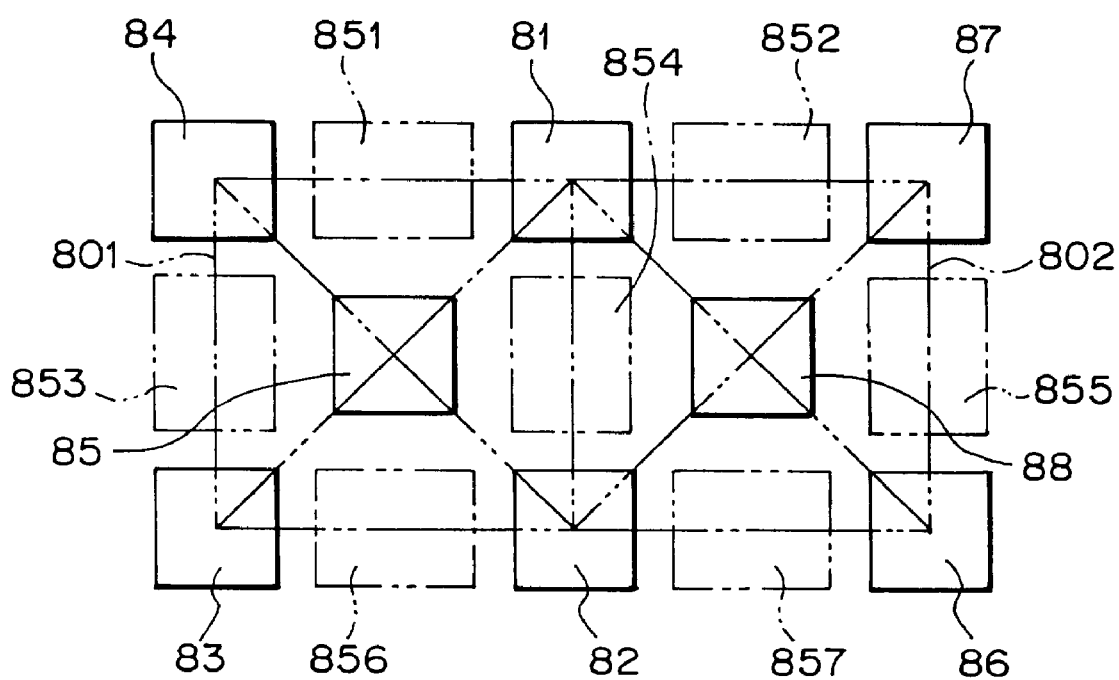
FIG. 11 is a schematic view showing a characteristic measuring pattern in a semiconductor device of the sixth embodiment of the present invention.

Next, the sixth embodiment will be explained. In the sixth embodiment, there are provided with two basic units, each of which is the characteristic measuring pattern shown in FIG. 1. Two electrode pads are shared by both the basic units. FIG. 11 is a schematic view showing a characteristic measuring pattern in a semiconductor device according to the sixth embodiment of the present invention.

In the sixth embodiment, eight electrode pads 81 to 88 may be disposed. A rectangle 801 is preferably formed by a line segment connecting the centers of the electrode pads 81 and 82, a line segment connecting the centers of the electrode pads 82 and 83, a line segment connecting the centers of the electrode pads 83 and 84, and a line segment connecting the centers of the electrode pads 84 and 81. A rectangle 802 is preferably formed by the line segment connecting the centers of the electrode pads 81 and 82, a line segment connecting the centers of the electrode pads 82 and 86, a line segment connecting the centers of the electrode pads 86 and 87, and a line segment connecting the centers of the electrode pads 87 and 81. The rectangles 801 and 802 are preferably congruent with each other.

Further, the electrode pad 85 may be disposed on the center of the rectangle 801, and the electrode pad 86 may be disposed on the center of the rectangle 802.

In this manner, in the sixth embodiment, the electrode pad 81 and 82 are shared by the two basic units.

Total seven measuring element regions 851 to 857 are provided between electrode pads located at vertexes of the rectangle 801 or 802.

In the characteristic measuring pattern of the semiconductor device of the sixth embodiment constructed in that manner, MOS transistors (not shown), each of which requires three electrode pads, may be disposed in the seven measuring element regions 851 to 857 as the measuring elements. The threshold voltage of each of the MOS transistors is measured in the same manner as those of the first to fifth embodiments.

Figure 12:
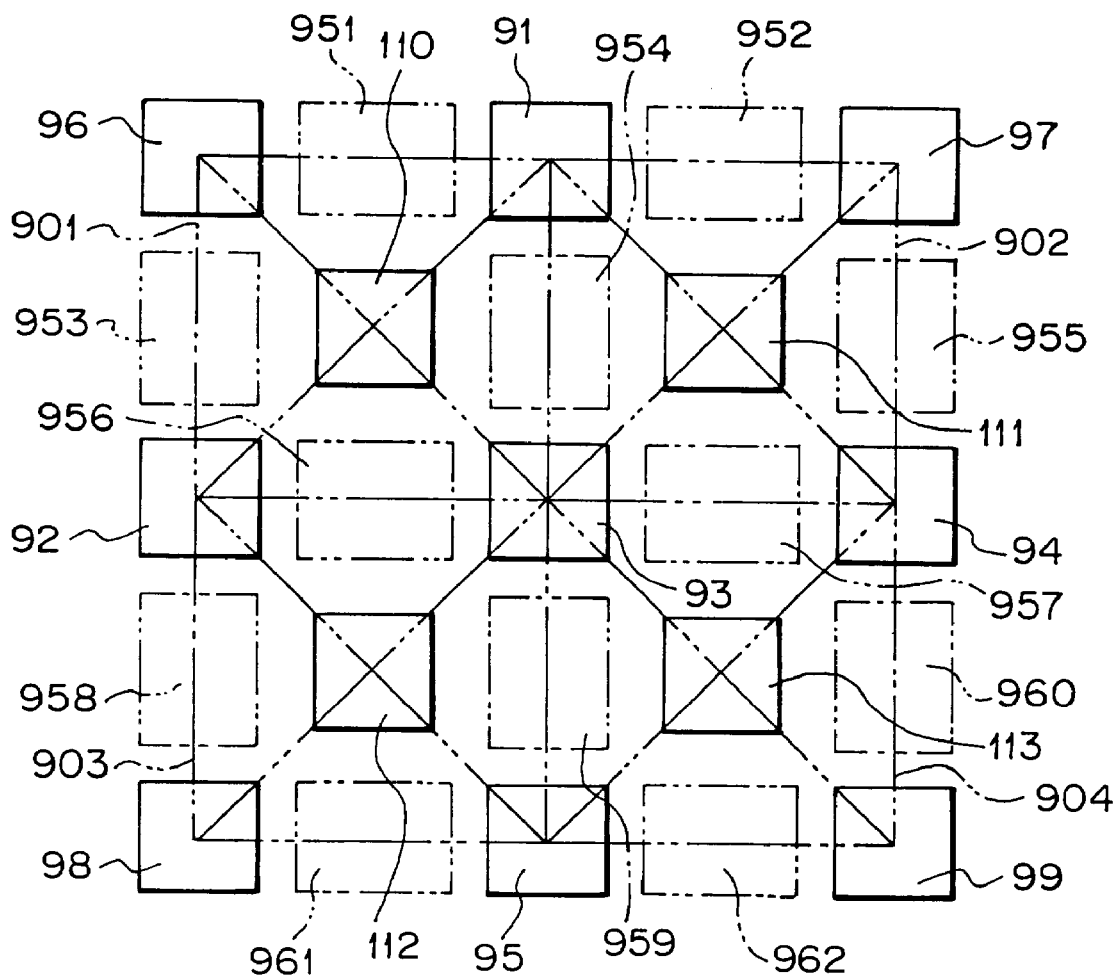
FIG. 12 is a schematic view showing a characteristic measuring pattern in a semiconductor device of the seventh embodiment of the present invention.

The seventh embodiment will be explained next. Four basic units are provided in the seventh embodiment, for example. Four electrode pads are shared by two of the basic units, and one electrode pad is shared by the four basic units. FIG. 12 is a schematic view showing a characteristic measuring pattern in a semiconductor device according to the seventh embodiment of the present invention.

In the seventh embodiment, thirteen electrode pads 91 to 99 and 110 to 113 are disposed, for example. A rectangle 901 is formed by connecting four centers of the electrode pads 91, 92, 93 and 96 as vertexes. The electrode pad 110 is preferably disposed on the center of the rectangle 901.

Similarly, a rectangle 902 is formed by connecting four centers of the electrode pads 91, 93, 94 and 97. The electrode pad 111 is preferably disposed on the center of the rectangle 902. A rectangle 903 is formed by connecting four centers of the electrode pads 92, 93, 95 and 98. The electrode pad 112 is preferably disposed on the center of the rectangle 903. A rectangle 904 is formed by connecting four centers of the electrode pads 93, 94, 95 and 99. The electrode pad 113 is preferably disposed on the center of the rectangle 904.

In the seventh embodiment, the electrode pads 91, 92, 94 and 95 are shared by two basic units, and the electrode pad 93 is shared by four basic units.

Total twelve measuring element regions 951 to 962 are provided among electrode pads located at vertexes of the rectangles 901, 902, 903 and 904.

In the characteristic measuring pattern of the semiconductor device of the seventh embodiment constructed in that manner, MOS transistors (not shown), each of which requires three electrode pads, may be disposed in the twelve measuring element regions 951 to 962 as the measuring elements. The threshold voltage of each of the MOS transistors is measured in the same manner as those of the first to fifth embodiments.

Figure 1:
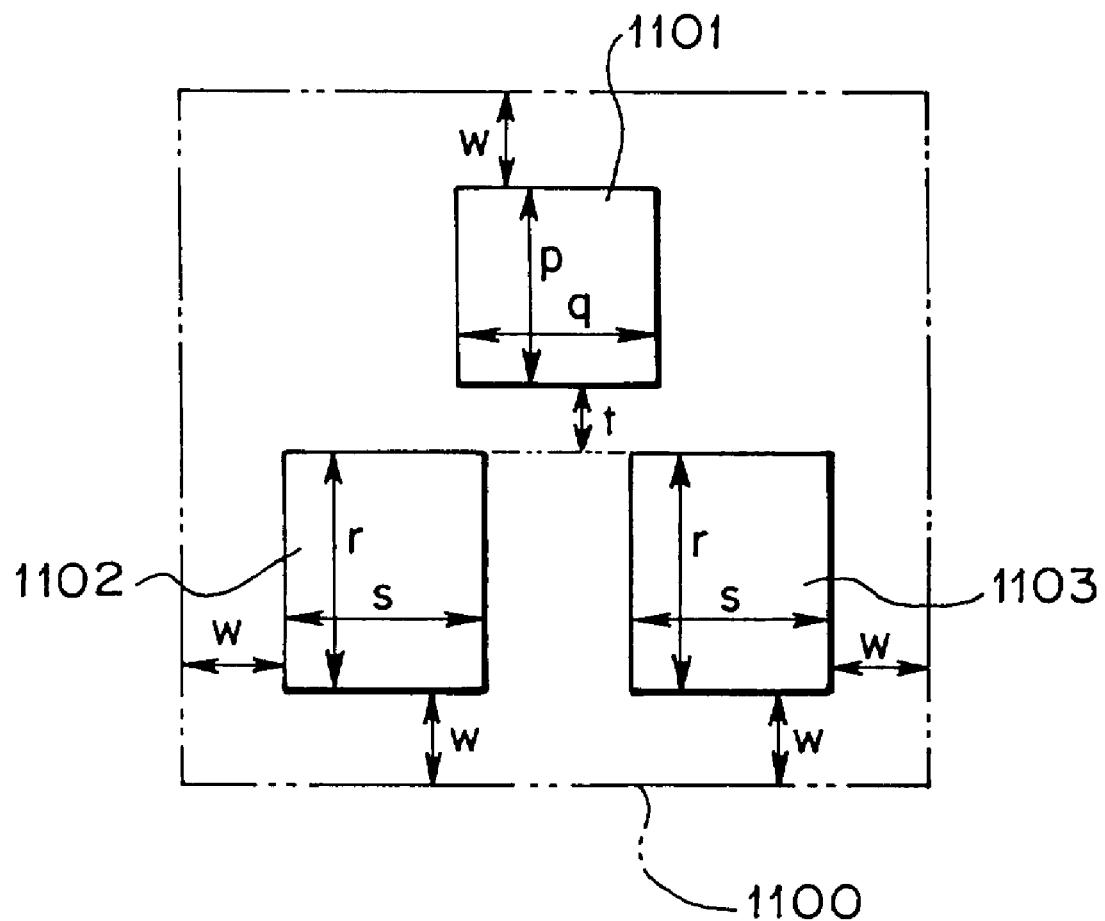
FIG. 1 is a schematic view showing the characteristic measuring pattern in an existing semiconductor device.

In general, supposing that the characteristic measuring pattern shown in FIG. 1 is a basic unit, if the basic units are arranged in m lines in n rows, and two electrode pads are shared by adjacent basic units, the following relation is established.

As shown in the sixth and seventh embodiments, when one measuring element region is provided between each pair of electrode pads located at adjacent vertexes of a rectangle and MOS transistor, which requires three electrode pads, is set in the measuring element region, the number X of measuring elements which can be disposed is expressed by the following equation (1):

$$X=2mn+(m+n) \quad (1)$$

For example, in the sixth embodiment shown in FIG. 11, since the number m of rows is 1 and the number n of lines is 2, the number X of measuring elements is 7. In the seventh embodiment shown in FIG. 12, since the number m of rows is 2 and the number n of lines is 2, the number X of measuring elements is 12.

Figure 13:
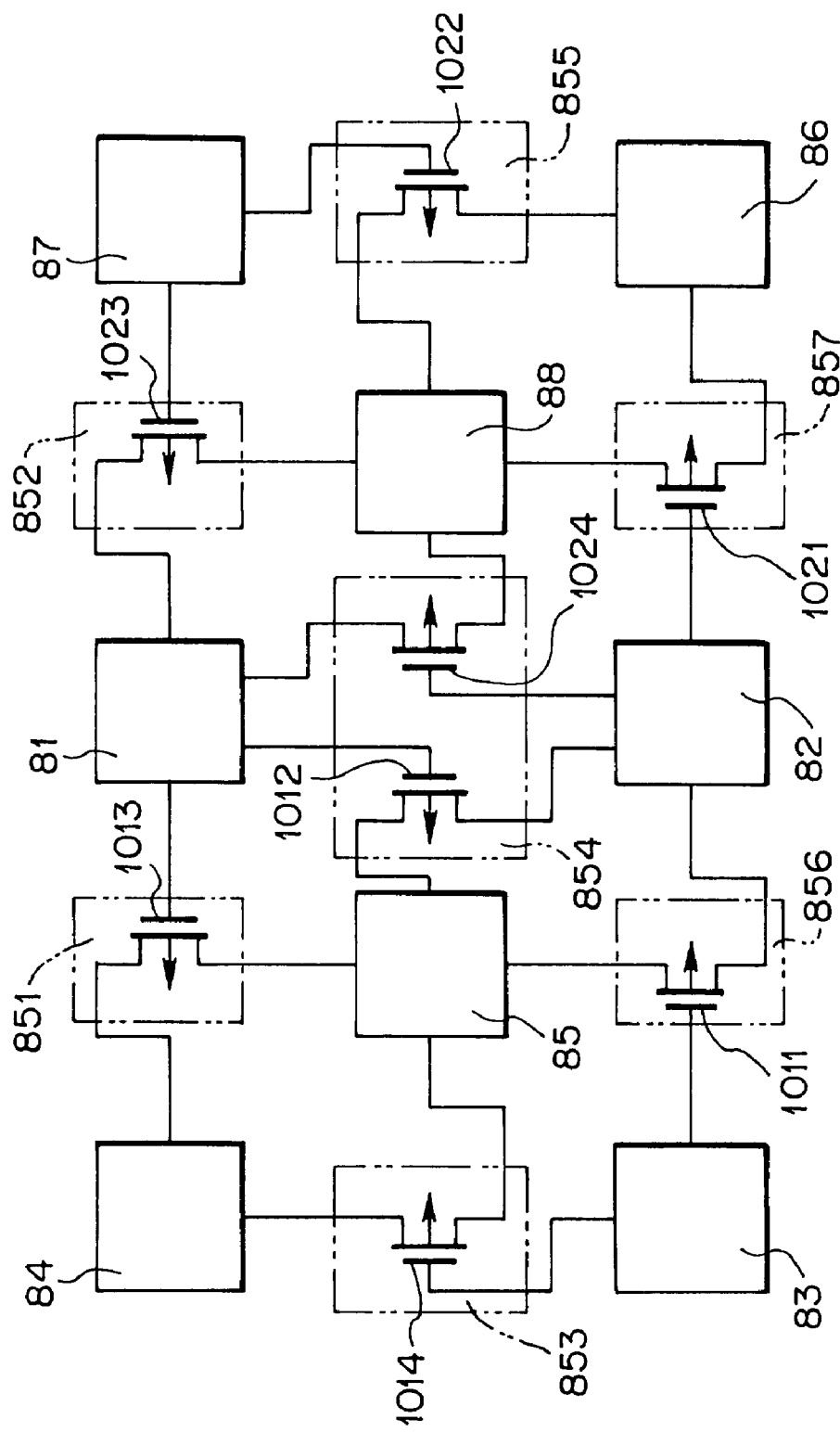
FIG. 13 is a schematic view showing a semiconductor device of the sixth embodiment in which two measuring elements are disposed in a measuring element region 854.

In the sixth and seventh embodiments, it is possible to dispose two measuring elements in a measuring element region between two electrode pads shared by two basic units, e.g., in the measuring element region 854 shown in FIG. 11 or in the measuring element region 954, 956, 957 or 959 shown in FIG. 12. FIG. 13 is a schematic view showing a semiconductor device of the sixth embodiment in which two measuring elements are disposed in the measuring element region 854.

P-channel MOS transistors 1013, 1014 and 1011 are disposed in measuring element regions 851, 853 and 856, respectively. P-channel MOS transistors 1023, 1022 and 1021 are disposed in measuring element regions 852, 855 and 857, respectively. The P-channel MOS transistors 1012 and 1024 are disposed in the measuring element region 854.

In this case, the basic units are disposed in m lines in n rows, the number Y of measuring elements which can be disposed is expressed by the following equation 2:

$$Y = 4mn \qquad (2)$$

The shape of the electrode pad is not limited to the rectangle including a regular square. For example, a hexagonal electrode pad, a circle electrode pad and a partially notched hexagonal or circle electrode pad can also be used. Further, a convex electrode pad can also be used, and the shape of an electrode pad may can be changed as necessary.

What is claimed is:

1. A semiconductor device, comprising:

a semiconductor substrate;

five electrode pads disposed on said semiconductor substrate, four of said electrode pads forming a rectangle, and the remaining one electrode pad being disposed on the substantial center of said rectangle; and a plurality of semiconductor elements disposed between said electrode pads, said semiconductor elements being connected to any of said five electrode pads and used for measuring characteristics.

2. A semiconductor device according to claim 1, comprising a plurality of basic regions including five electrode pads disposed as same as said five electrode pad, and two of said electrode pads are shared by two of said basic regions.

3. A semiconductor device according to claim 1, wherein said semiconductor elements are connected to said electrode pads located at vertexes of said rectangle.

4. A semiconductor device according to claim 1, wherein wherein said rectangle is a regular square.

5. A semiconductor device according to claim 1, wherein said semiconductor element is a transistor.

6. A semiconductor device according to claim 1, wherein said plurality of semiconductor elements include at least an N-channel MOS transistor and a P-channel MOS transistor.

7. A semiconductor device according to claim 5, wherein said transistor is a field-effect transistor, any one of a gate, a drain and a source of said field-effect transistor is connected to said electrode pad located at the substantial center of said rectangle, and the remaining two of said gate, said drain and said source of said field-effect transistor are connected to said electrode pads located at vertexes of said rectangle.

* * * * *